(12) United States Patent
Asai et al.

(10) Patent No.: US 6,326,239 B1
(45) Date of Patent: Dec. 4, 2001

(54) MOUNTING STRUCTURE OF ELECTRONIC PARTS AND MOUNTING METHOD OF ELECTRONIC PARTS

(75) Inventors: Yasutomi Asai, Okazaki; Hirokazu Imai, Anjo; Yuji Ootani, Okazaki; Takashi Nagasaka, Anjo, all of (JP)

(73) Assignee: Denso Corporation, Kariya (JP)

( * ) Notice: Subject to any disclaimer, the term of this patent is extended or adjusted under 35 U.S.C. 154(b) by 0 days.

(21) Appl. No.: 09/287,016

(22) Filed: Apr. 6, 1999

(30) Foreign Application Priority Data

Apr. 7, 1998 (JP) .................................................. 10-094874
Oct. 27, 1998 (JP) .................................................. 10-305507
Feb. 22, 1999 (JP) .................................................. 11-043801

(51) Int. Cl.[7] .................................................. H01L 23/28
(52) U.S. Cl. .......................... 438/112; 438/115; 438/106; 438/110
(58) Field of Search .................................... 438/106, 107, 438/108, 109, 110, 111, 112, 115; 257/778, 779, 780, 781, 783, 777, 784, 782, 786

(56) References Cited

U.S. PATENT DOCUMENTS

| 5,523,622 | * | 6/1996 | Harada et al. ........................ 257/778 |
| 5,677,575 | * | 10/1997 | Maeta et al. .......................... 257/778 |
| 5,976,912 | * | 11/1999 | Fukutomi et al. .................... 438/110 |
| 6,046,071 | * | 4/2000 | Sawai et al. .......................... 438/106 |

FOREIGN PATENT DOCUMENTS

| 56-167394 | 12/1981 | (JP) . |
| 4-336490 | 11/1992 | (JP) . |
| 6-79148 | 11/1994 | (JP) . |
| 9-17601 | 1/1997 | (JP) . |
| 9-232371 | 9/1997 | (JP) . |

\* cited by examiner

Primary Examiner—Charles Bowers
Assistant Examiner—Laura Schillinger
(74) Attorney, Agent, or Firm—Pillsbury Winthrop LLP

(57) ABSTRACT

A mounting structure includes a laminated ceramic capacitor mounted on a mounting substrate. The laminated ceramic capacitor includes a main body chip made by a ceramic dielectric, internal layer electrodes, and pair of terminal electrodes. The mounting substrate is made by alumina substrate, and has a pair of substrate electrodes made by copper plating. The laminated ceramic capacitor is mounted on the mounting substrate by using an Ag paste. Here, the substrate electrode is set to be smaller than the Ag paste. That is, the Ag paste is extruded from the terminal electrodes and the substrate electrode so as to contact to both of the main body chip and the mounting substrate. Because the Ag paste has a high adhesive strength compared to that when it is bonded with a metal, total adhesive strength can be improved. Consequently, the reliability of mounting can be improved.

12 Claims, 10 Drawing Sheets

BEFORE REFLOW

AFTER REFLOW

BEFORE HARDEN

AFTER HARDEN

MOUNTING STRUCTURE OF ELECTRONIC PARTS AND MOUNTING METHOD OF ELECTRONIC PARTS

CROSS REFERENCE TO RELATED APPLICATION

This application is based upon Japanese Patent Applications No. Hei. 10-94874 filed Apr. 7, 1998, No. Hei. 10-305507 filed Oct. 27, 1998, and No. Hei. 11-43801 filed Feb. 22, 1999, the contents of which are incorporated herein by reference.

BACKGROUND OF THE INVENTION

1. Field of the Invention

The present invention related to a mounting structure and a mounting method of an electronic part such as a semiconductor element, a chip type capacitance or a resistor, which is electrically connected to a mounting substrate via electrodes.

2. Related Arts

In one conventional mounting structure for an electric circuit device such as a HIC (Hybrid Integrated Circuit), when surface mounting electronic part is mounted on a substrate, a conductive adhesive such as Ag (silver) paste is used to mount them for the purpose of Pb(lead)-free or fleon-free (elimination of a washing process for washing flux remains).

FIG. 15 shows the above-mentioned conventional mounting structure. In this figure, a laminated ceramic capacitor 42 for surface mounting, which has a pair of electrodes 43, is mounted on a mounting substrate 41 made by an insulating material such as ceramic or resin. This mounting structure is obtained by following process. That is, the laminated ceramic capacitor 42 is mounted on the mounting substrate 41. The Ag paste 44 is transcribed on the pair of electrodes 43 of the mounting substrate 41 by a screen printing. The laminated ceramic capacitor 42 is mounted on the Ag paste 44 with a predetermined load and time condition. Then Ag paste is hardened.

According to a thermal cycle test (from −40° C. to 150° C., 1000 cycles) on the above-described conventional mounting structure, it is found that cracks are generated in some interfaces, and that junctions of the interfaces may be deteriorated by the cracks. Here, the interfaces include the one between electrodes 42a of the laminated ceramic capacitor 42 and the Ag paste 44, and between the electrodes 43 of the mounting substrate 41 and the Ag paste 44. These cracks may occur in the following manner.

In a mounting structure using a reflow soldering, flux components remove dirt such as oxide compounds or organic matters on the electrodes of the electronic part and the electrodes of the mounting substrate, and the solder and electrode materials are metallically bonded each other due to a reflow heating. Hence, a dependency of a bonded state against the electrode materials is rather small.

On the other hand, in the mounting structure using Ag paste 44, Ag fillers, which exist in the Ag paste 44 independently, are connected in chains each other and are connected to each electrode 42a, 43 in proportion to hardening and contraction of a binder resin in the Ag paste 44.

Therefore, the bonded state is likely to be affected by the electrode material (specifically surface material), and an adhesive strength between each of the electrodes 42a, 43 and the Ag paste becomes small compared to that of soldering.

According to investigation to check where the cracks are generated in the Ag paste 44 in the thermal cycle test, it is found that the cracks are generated mainly at peripheral portion of bonded portions between Ag paste 44 and the electrodes 42a, 43. That is, the cracks are generated at bonded portions where the adhesive strength becomes small due to heating contractions of Ag paste 44 under high temperature.

In another conventional mounting structure, an electronic part having a narrow pitch land (electrode) such as a semiconductor element is mounted on a mounting substrate by a flip chip mounting by using a solder. This mounting structure is obtained by following steps shown in FIGS. 16A–16D.

As shown in FIG. 16A, a mounting substrate 52 having electrodes (electrodes or lands) 51 is provided. As shown in FIG. 16B, solder pastes 53 are printed on the mounting substrate 52. Here, a diameter of each solder pastes 53 is substantially equal to that of land 51 to obtain desired bonded lifetime of the solder. As shown in FIG. 16C, a semiconductor element having solder bumps 54 is aligned and mounted on the mounting substrate. The solder bumps 54 and the solder pastes 53 are bonded by melting each other by a reflow process. Then, the semiconductor element 55 is electrically connected to the mounting substrate 52, as shown in FIG. 16D.

In this conventional mounting structure, one of a pattern tolerance of the lands 51, a printing displacement of the solder paste 53, and a mounting displacement of the semiconductor element relative to the mounting substrate may occur. Hence, the lands 51 and the solder paste 55 may be displaced each other. However, the solder paste 53 and the solder bump 54 are melted, and spread on the lands 53, then the melted solder will return to the lands 51. The solder pastes 53 need to contact at more than half area with the lands 51 to have the melted solder return to the lands 51 completely. On the other hand, when the solder pastes 53 contact the lands 51 at less than half area, the melted solder may not return to the lands 51 completely. In such a case, the melted solder may remain on the mounting substrate as a solder ball, or be merged with the adjacent solder at the adjacent land 51, then the adjacent lands 51 may be short-circuit by the melted solder as shown in FIG. 17.

Consequently, reliability of electrical connection of the semiconductor element or the electronic part may decrease due to the decreasing of an amount of the solder of lands 51 or short-circuit between adjacent lands 51.

Recently, a land pitch of the semiconductor element 55 is desired to be less than 300 $\mu$m for the purpose of fining. When the ceramic laminated substrate is employed as the mounting substrate 52, the pattern accuracy may be decreased due to non-uniformity of baking contraction, and a size tolerance of around 1% will be generated. Therefore, the following accuracy is severely required to satisfy this desire. Here, the accuracy includes a pattern accuracy of the land 51 provided on the mounting substrate 52, a printing alignment of the solder pastes 53, accuracy of weight of each solder paste, and a mounting accuracy of the semiconductor element 55 to the mounting substrate 52.

However, when the semiconductor element has a size of 10 mm×10 mm, at a peripheral portion of the semiconductor element 55, the pattern tolerance may be 0.07 mm, the printing displacement may be 0.05 mm, and the mounting displacement may be 0.03 mm. In this case, the displacement between the solder paste 53 and the solder bump 54 with respect to the land 51 is estimated to be around 0.13 mm by calculating root mean square of each displacement. When the land pitch is set to be less than this estimated value, adjacent solders may be merged to short-circuit.

However, since the size of land 51 is determined based on the bonded lifetime or predetermined displacements, the land pitch can not be set to be less than 0.28 mm when the land size is set to 0.15 mm.

SUMMARY OF THE INVENTION

The present inventions are made in view of the above-mentioned inconvenience of the conventional mounting structures.

The present invention is based on the finding that a conductive adhesive such as Ag paste has a high adhesive strength when it is bonded with a ceramic or an insulating material, compared to that when the Ag paste is bonded with a metal. Here, the ceramic is used for a body member of a bonding substrate or a laminated ceramic capacitor (e.g. alumina). The insulating material is used for a mounting substrate (e.g. resin or ceramic).

A first object of the present invention is to provide a mounting structure or a mounting method of an electronic part, which can prevent cracks from generation in a conductive adhesive, when the electronic part, which has a body member formed by an insulating material and electrodes exposed to a surface of the body member, is mounted on electrodes formed on the mounting substrate via the conductive adhesive.

A second object of the present invention is to provide a mounting structure or a mounting method of electronic part, which can reduce a pitch of lands (electrodes).

A first aspect of the present invention is that one part of a conductive adhesive is enlarged (extruded) from lands or electrodes to improve an adhesive strength of the conductive adhesive. According to this mounting structure, the enlarged (extruded) portion will be bonded to the other portion different from the lands or electrodes.

A second aspect of the present invention is that one part of a conductive adhesive is enlarged (extruded) from lands or electrodes to improve an adhesive strength of the conductive adhesive. The electronic part comprises a body member made by a material whose adhesive strength between the conductive adhesive is larger than that between the electrodes and the conductive adhesive. The mounting substrate is made by a material whose adhesive strength between the conductive adhesive is larger than that between the first and the second lands and the conductive adhesive. According to this mounting structure, the enlarged (extruded) portion will be bonded to the other portion different from the lands or electrodes.

A third aspect of the present invention is that a mounting method of an electronic part includes the step of printing a conductive adhesive on a first and a second lands provided on the mounting substrate, to have a size larger than that of the first and the second lands. According to this mounting method, the large-sized portion will be bonded to the other portion different from the lands or electrodes to improve an adhesive strength of the conductive adhesive.

BRIEF DESCRIPTION OF THE DRAWINGS

These and other objects, features and characteristics of the present invention will be appreciated from a study of the following detailed description, the appended claims, and drawings, all of which form part of this application. In the drawings:

DETAILED DESCRIPTION OF THE PREFERRED EMBODIMENTS

Preferred embodiments of the present invention are explained in detail with reference to accompanying drawings. In the following embodiments, corresponding parts or portions are put the same label in figures through the embodiments, and parts of explanations of them are omitted.

First Embodiment

In the first embodiment, a laminated ceramic capacitor is employed as a surface mounting electronic part. This embodiment will be explained with reference to FIG. 1, which shows a cross-sectional view when the laminated ceramic capacitor (electronic part) 11 is mounted on a mounting substrate 14, and FIG. 2, which shows a plan view showing around an Ag paste in FIG. 1.

The laminated ceramic capacitor 11 is so-called 3216 in size, and includes a main body chip (body member) 12, internal layer electrodes (not shown), and a pair of terminal electrodes (electrode) 13.

Figure 2:
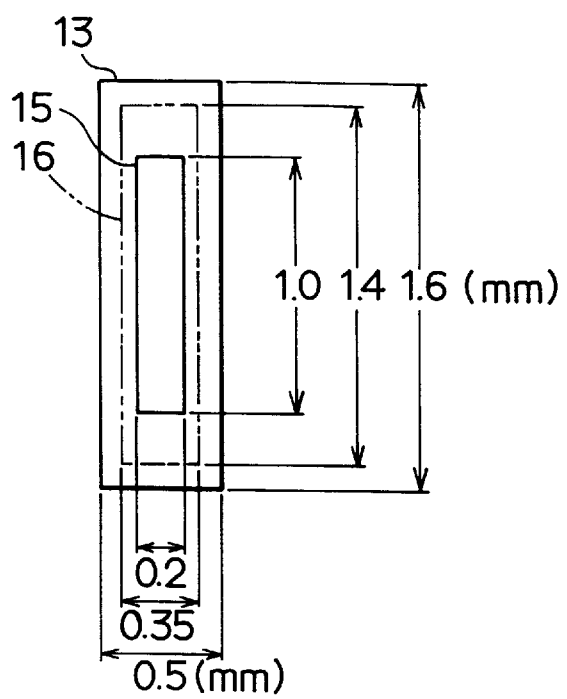
FIG. 2 is a plan view showing a part around an Ag paste according to the first embodiment.

The main body chip 12 is formed in a hexahedral (3.2 mm in length, 1.6 mm in width, 1.25 mm in height) and made by a ceramic dielectric. The internal layer electrodes are made by Ag—Pb alloy or the like, and are arranged in the main body chip 12 by alternately laminated by several pieces. At the side surfaces, which are faced each other, of the main body chip 12 (side surfaces where the internal layer electrodes are exposed), the terminal electrodes 13 are provided so as to connect each of the internal layer electrodes. Here, an outer surface of the terminal electrode 13 is exposed. As shown in FIG. 2, a size of contact of the terminal electrode 13 (projection of the bottom surface) is set to, for example, 0.5 mm×1.6 mm.

The mounting substrate 14, which is for mounting the above-mentioned laminated ceramic capacitor 11, is made by 92% alumina substrate or the like. A pair of substrate electrodes 15 made by copper plating or the like is formed on the mounting substrate 14. Here, an area of each substrate electrode 15 is set to be smaller than the contact area of the terminal electrode 13 of the laminated ceramic capacitor 11 (e.g. around ¼ in area), specifically, a size of 0.2 mm×1.0 mm, as shown in FIG. 2. Leading wires from the mounting substrate 14 can be realized by wire patterns provided on the mounting substrate or through hole wires provided in the mounting substrate 14.

The laminated ceramic capacitor 11 is mounted on the mounting substrate 14 by using an Ag paste (conductive adhesive, conductive bonding member) 16.

Specifically, before the mounting, the Ag paste 16 is screen printed at a peripheral portion of the pair of substrate electrode 15 on the mounting substrate 14 with a thickness of, for example, 70±20 µm, and with a print size of, for example, 0.35 mm×1.4 mm. By setting the print size to the above-mentioned size, the substrate electrode 15 is set to be smaller than the Ag paste 16. The Ag paste includes an amine hardening type epoxy resin as a binder. A compounding ratio of an Ag filler and the epoxy rein is set to 80:20 (Wt %).

Figure 1:
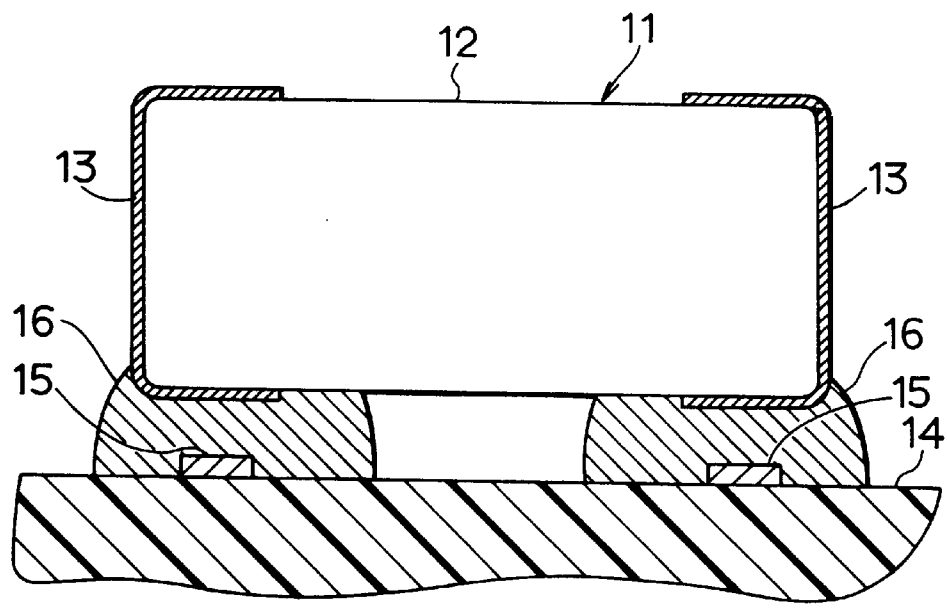
FIG. 1 is a cross-sectional view showing a mounting structure of an electronic part according to a first embodiment of the present invention.

Then, the laminated ceramic capacitor 11 is mounted on the Ag paste 16 in a condition that a load is 1 (N), time is 0.5 (sec). Here, as shown in FIG. 1, the Ag paste is spread (extruded) into between the laminated ceramic capacitor 11 and the mounting substrate 14 so that a contacted area is enlarged. That is, the Ag paste 16 is enlarged (extruded) from the substrate electrode 15 enough to contact to the main body chip 12 as the body member. Controlling the load applied to the laminated ceramic capacitor 11 can control a shape of the Ag paste, specifically the contact area of the Ag paste. When the Ag paste 16 is formed thicker than a certain thickness of which is produced after the Ag paste 16 is hardened, the Ag paste 16 will be extruded from the substrate electrode 15 with high reliability.

The shape of the Ag paste can be also controlled by vibrating the laminated ceramic capacitor 11 and/or the mounting substrate 14.

The Ag paste is hardened by annealing the bonded structure of the laminated ceramic capacitor 11 and the mounting substrate 14 under the predetermined condition in an oxidation suppression atmosphere. By this annealing, the terminal electrode 13 and the substrate electrode 15 are electrically connected by the Ag filler in the Ag paste, and the peripheral portion of the Ag paste 16 is bonded by a face-contact to each of the main body chip 12 of the laminated ceramic capacitor 11 and the mounting substrate 14.

The main body chip 12 of the laminated ceramic capacitor 11 and the mounting substrate 14 are made by insulating member such as ceramic. According to the experiment to check a bonded state when the Ag paste 16 is bonded to the insulating member, it is found that the bonded state is much better than the bonded state when the Ag paste 16 is bonded to a metal.

Therefore, when the peripheral portion of the Ag paste 16 is bonded by a face-contact to each of the main body chip 12 of the laminated ceramic capacitor 11 and the mounting substrate 14, the adhesive strength can be improved compared to when the Ag paste 16 is bonded only the metal (electrode). Then, the generation of cracks can be prevented effectively, even when the Ag paste contracts due to the annealing. Consequently, the reliability of mounting can be improved.

Figure 3:
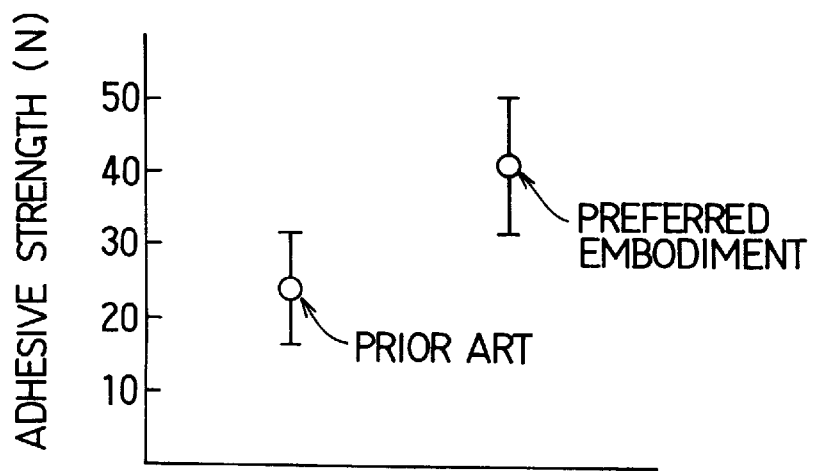
FIG. 3 is a graph showing an adhesive strength of the mounting structure according to the first embodiment compared to that of prior art.

FIG. 3 shows the adhesive strength of two kind of capacitors to validate the improvement of adhesive strength of the above-mentioned mounting structure. Here, one group of capacitors are formed by the laminated ceramic capacitor using the mounting structure of this preferred embodiment, another group of capacitors are formed by the laminated ceramic capacitor using conventional mounting structure. According to FIG. 3, the preferred embodiment, in which the peripheral portion of the Ag paste 16 is bonded to the main body chip 12, has high adhesive strength compared to conventional mounting structure, in which the peripheral portion is not bonded.

According to this embodiment, one part of the conductive adhesive is extruded from land or electrode. The body member is made by a material whose adhesive strength between the conductive adhesive is larger than that between the first and the second electrodes and the conductive adhesive. The mounting substrate is made by a material whose adhesive strength between the conductive adhesive is larger than that between the first and the second lands and the conductive adhesive. Therefore, the enlarged (extruded) portion will be bonded to the other portion different from the lands or electrodes, then the adhesive strength of the conductive adhesive can be improved.

Second Embodiment

Figure 4:
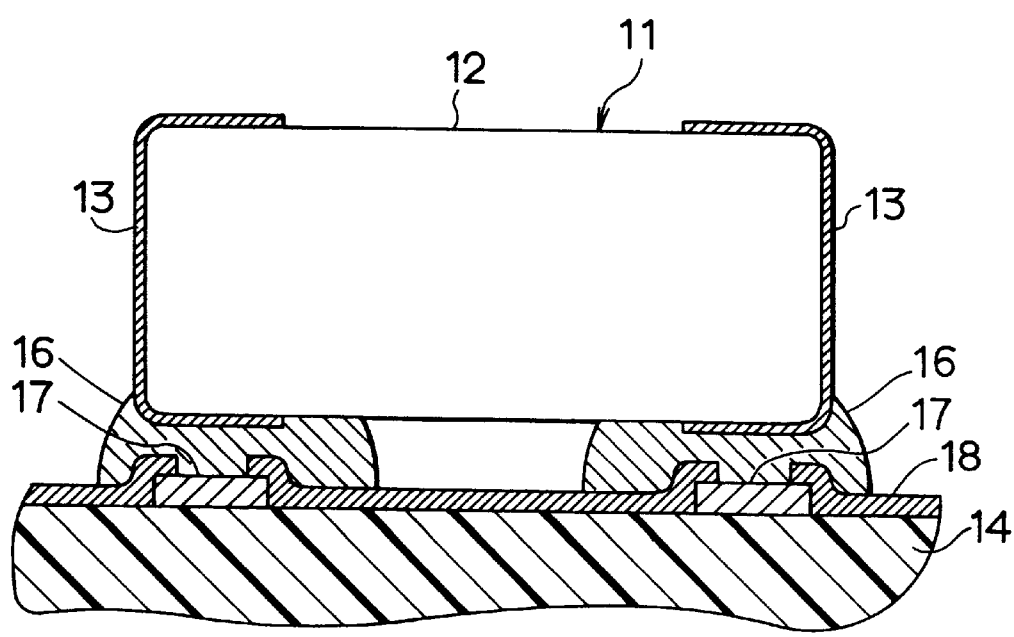
FIG. 4 is a cross-sectional view showing a mounting structure of an electronic part according to a second embodiment of the present invention.

In FIG. 4 showing a second embodiment, an area of the substrate electrode is set to relatively small compared to the Ag paste (conductive adhesive, conductive bonding member) 16.

More especially, pair of substrate electrodes 17, made by copper plate or the like, are formed on the mounting substrate 14 at the region where the laminated ceramic capacitor 11 will be mounted. A passivation film 18, made by insulating material such as glass or resin, is formed on the mounting substrate 14, and has openings at the region where the substrate electrodes 17 exist. The substrate electrodes 17 are partially exposed via the openings. The opening has a size of, for example, 0.2 mm×1.0 mm. The exposed area of the substrate electrodes 17 is set to be smaller than the size of Ag paste.

Then, the laminated ceramic capacitor 11 is mounted on the mounting substrate 14 so as to be aligned to the screen printed Ag paste and the pair of the substrate electrodes 17, and the Ag paste 16 is hardened. By this process, the terminal electrode 13 and the substrate electrode 17 are electrically connected via the Ag filler in the Ag paste 16, and the peripheral portion of the Ag paste 16 is bonded by a face-contact to each of the main body chip 12 of the laminated ceramic capacitor 11 and the passivation film 18 of the mounting substrate 14. Therefore, since the peripheral portion of the Ag paste 16 is bonded by the face-contact to the passivation film 18, which is made by the insulating material, the adhesive strength can be improved.

As described the above, when a coating material is formed on the substrate electrodes 17, and the exposed area of the substrate electrode 17 is set to be smaller than the size of the Ag paste, the same merit as the first embodiment can be obtained. Furthermore, since the substrate electrode 17 can be covered with the coating material, a shape of the substrate electrode 17 itself will not restricted.

Third Embodiment

Figure 5A:
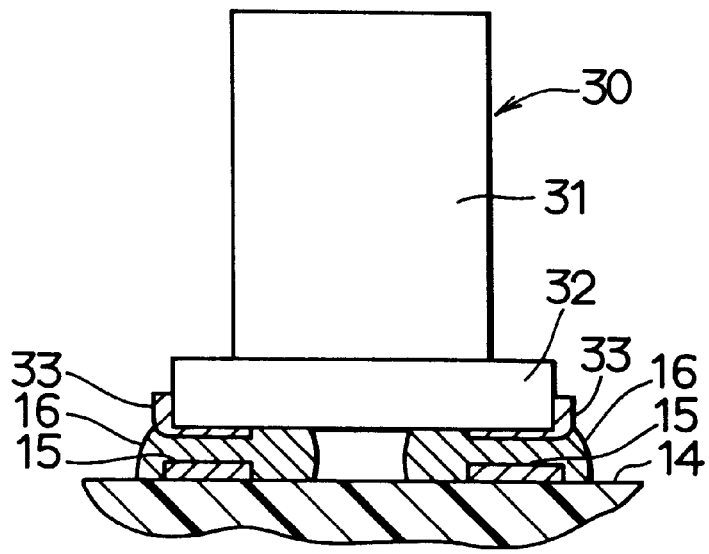
FIG. 5A is a cross-sectional view showing a mounting structure of an electronic part according to a third embodiment of the present invention.
Figure 5B:
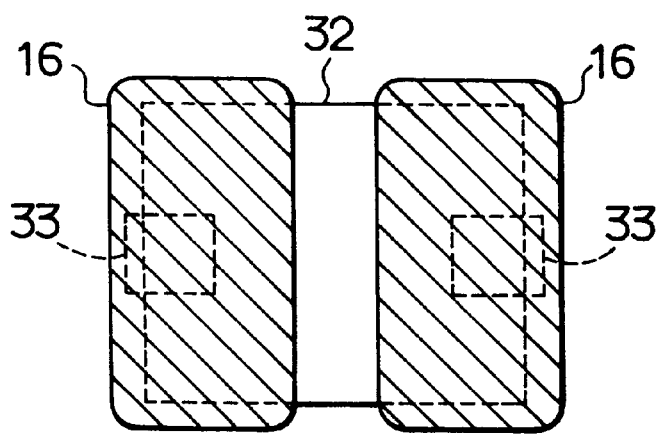
FIG. 5B is a plan view showing a part around an Ag paste according to the third embodiment.

As shown in FIGS. 5A, 5B, which show a third embodiment, a surface mounting electronic part is a surface mounting aluminum electrolytic capacitor 30. The aluminum electrolytic capacitor 30 includes a capacitor main body 31, a base portion (body member) 32 provided at the base of the capacitor main body 31, and a pair of terminal electrodes (electrodes) 33 provided at the back surface of the base portion 32. The terminal electrode is partially exposed.

Then, the laminated ceramic capacitor 11 is mounted on the mounting substrate 14 so as to be aligned with the screen printed Ag paste (conductive adhesive, conductive bonding member) 16 and the pair of the substrate electrodes 15, and the Ag paste is hardened. By this process, the terminal electrode 33 and the substrate electrode 15 are electrically connected via the Ag filler in the Ag paste 16, and the peripheral portion of the Ag paste 16 is bonded by a face-contact to each of the base portion 32 of the aluminum electrolytic capacitor 30 and the mounting substrate 14. Therefore, since the peripheral portion of the Ag paste 16 is bonded by the face-contact to the mounting substrate 14, which is made by the insulating material, the adhesive strength can be improved.

As described the above, when the present invention is adapted to the aluminum electrolytic capacitor 30, which has the terminal electrodes 33 are provided with exposed at the back surface of the base portion 32, the same merit as the first embodiment can be obtained.

Fourth Embodiment

Figure 6:
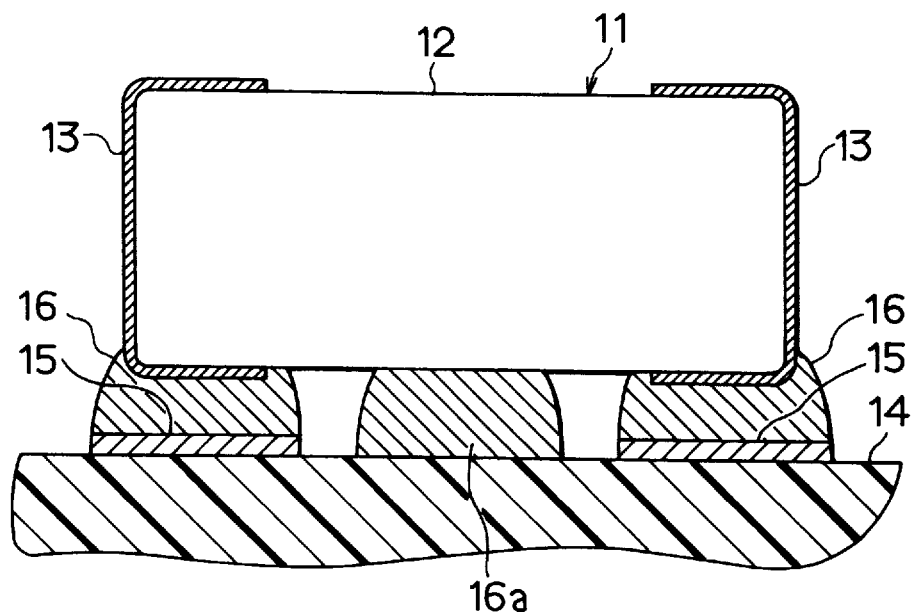
FIG. 6 is a cross-sectional view showing a mounting structure of an electronic part according to a fourth embodiment of the present invention.

As shown in FIG. 6, which shows a fourth embodiment, an Ag paste 16a is printed at the other region different from the substrate electrodes 15 on the mounting substrate 14 in addition to the Ag paste 16. The Ag paste 16a is bonded by a face-contact directly or indirectly to at least one of the main body chip 12 and the mounting substrate 14. In this embodiment, the Ag paste 16a is bonded by the face-contact to each of the main body chip 12 and the mounting substrate 14.

Since the Ag paste 16a is provided at the other region of the substrate electrodes 15 on the mounting substrate 14 in addition to the Ag paste 16, the adhesive strength between the mounting substrate 14 and the laminated ceramic capacitor 11 can be improved.

Here, in FIG. 6, the peripheral portion of the Ag paste 16 is ended within the substrate electrode 15. However, it is acceptable to print the Ag paste 16 so as to extrude from the substrate electrode 15.

Fifth embodiment

Figure 7:
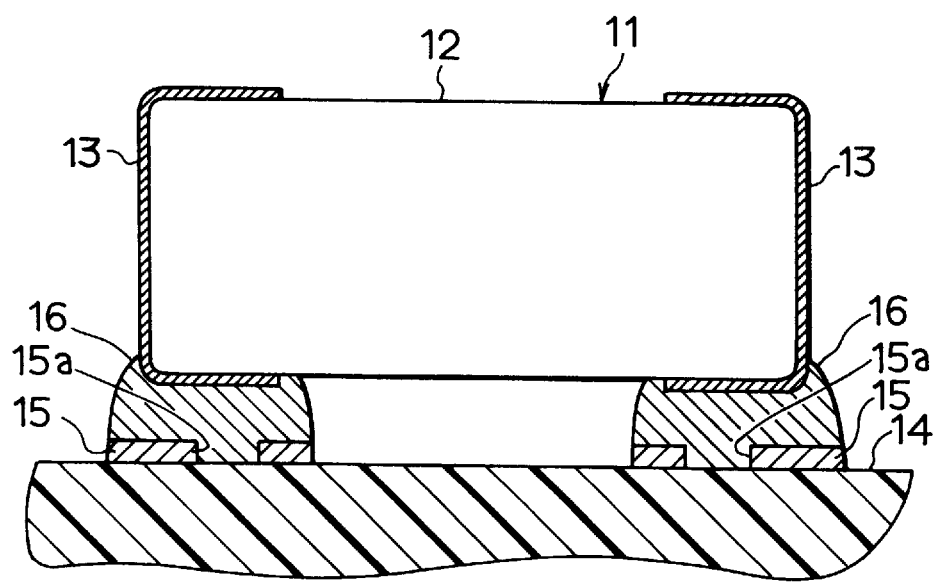
FIG. 7 is a cross-sectional view showing a mounting structure of an electronic part according to a fifth embodiment of the present invention.

As shown in FIG. 7, which shows a fifth embodiment, the substrate electrode 15 has a slit (exposing hole portion) 15a. The mounting substrate 14 is partially exposed via the slit 15a. Then the Ag paste 16 is bonded by a face-contact to the mounting substrate 14 via the slit 15a.

As described the above, when the substrate electrode 15 has a slit 15a, the same merit as the first embodiment can be obtained. Here, the slit 15a can be provided at plural regions of the substrate electrode 15.

Here, in FIG. 7, the peripheral portion of the Ag paste 16 is ended within the substrate electrode 15. However, it is acceptable to print the Ag paste 16 so as to extrude from the substrate electrode 15.

Sixth Embodiment

Figure 8:
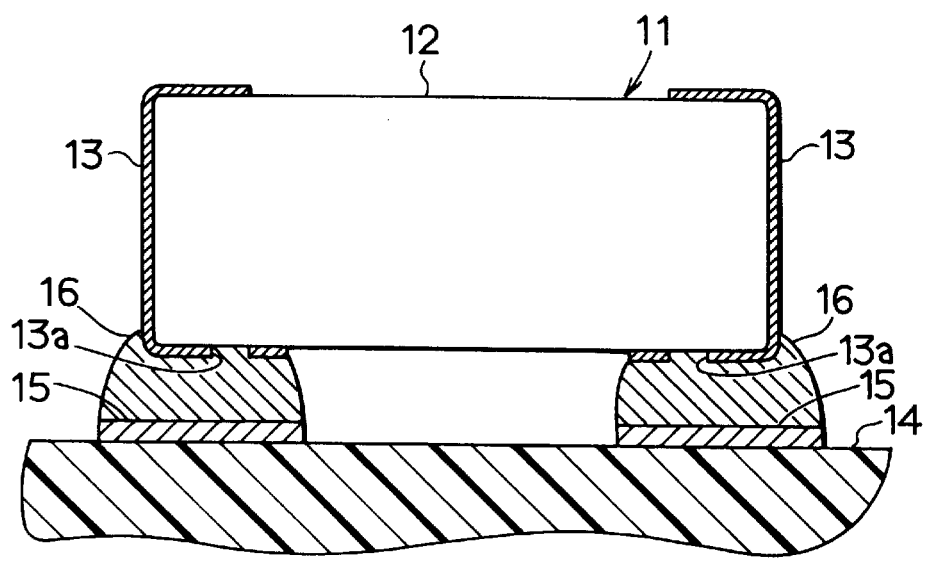
FIG. 8 is a cross-sectional view showing a mounting structure of an electronic part according to a sixth embodiment of the present invention.

As shown in FIG. 8, which shows a sixth embodiment, the terminal electrode 13 has a slit (exposing hole portion) 13a. The main body chip 12 is partially exposed via the slit 13a. Then the Ag paste 16 is bonded by a face-contact to the main body chip 12 via the slit 13a.

As described the above, when the terminal electrode 13 has a slit 13a, the same merit as the first embodiment can be obtained. Here, the slit 13a can be provided at plural regions of the substrate electrode 13.

Here, in FIG. 8, the peripheral portion of the Ag paste 16 is ended within the substrate electrode 15. However, it is acceptable to print the Ag paste 16 so as to extrude from the substrate electrode 15, or to extrude from the terminal electrode 13.

Seventh Embodiment

Figure 9:
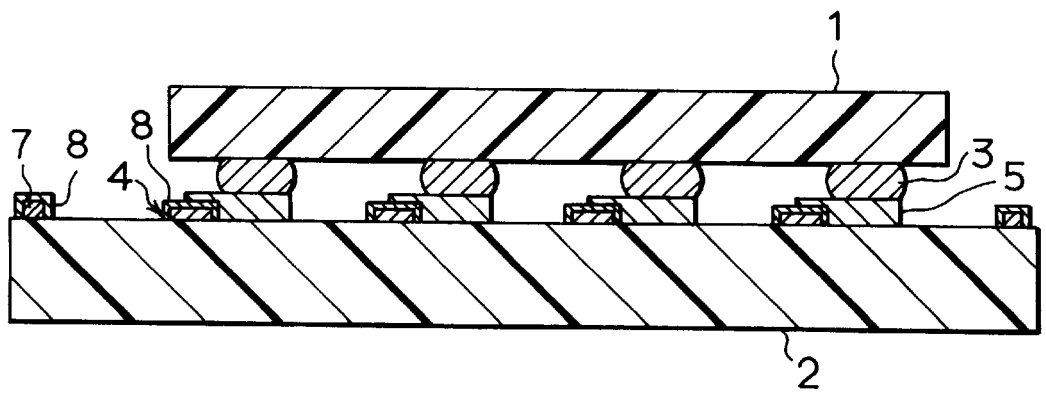
FIG. 9 is a cross-sectional view showing a mounting structure of an electronic part according to a seventh embodiment of the present invention.

In this embodiment, a flip-chip type semiconductor is employed as the electronic part, and as shown in FIG. 9, a semiconductor element 1 as the electronic part is mounted on an alumina-laminated substrate (mounting substrate) 2 by a flip-chip method.

The semiconductor element 1, which has a size of 10 mm×10 mm, has a plurality of solder bumps 3 (electrodes 3) on its back surface. Each of the solder bumps 3 has a diameter of substantially 0.1 mm. Thirty-two solder bumps 3 are arranged in square shapes at a surrounding portion of the semiconductor element 1 with 0.25 mm pitch each other.

Lands (substrate electrode) 4 are formed on the alumina laminated substrate 2 at the area corresponding to the solder bumps 3. Each land 4 has a diameter of 0.08 mm, and is formed by following steps, wherein tungsten is sintered with an alumina. Then a copper plate 8 is formed on the sintered tungsten.

Furthermore, Ag pastes (conductive adhesive, conductive bonding member) 5 are formed on the alumina-laminated substrate 2 by printing and coating so as to be electrically connected to each of the lands 4. The Ag paste 5 has a diameter of 0.15 mm, and is made by epoxy resin including Ag filler. Hence, the diameter of the land 4 is smaller than that of the Ag paste 5. Specifically, in the direction in which the lands 4 are arranged, a size (width) of each land 4 is smaller than that of Ag paste.

The semiconductor element 1 is mounted on the alumina-laminated substrate 2 after alignment so that the solder bump 3 corresponds to the Ag paste 5. The Ag pastes 5 are electrically connected to the solder bumps 3 by annealing to electrically connect the semiconductor element 1 and the alumina-laminated substrate 2.

Here, as shown FIG. 9, the Ag pastes 5, which are used for electrically connecting the semiconductor element 1 and the alumina-laminated substrate 2, are not spread at this timing, but are maintained as printed.

At the regions, where the semiconductor element 1 is not mounted on the alumina-laminated substrate 2, a dummy land 7, which is not electrically connected to the semiconductor element 1, is formed. This dummy land 7 is used as alignment mark to indicate a position of the lands 4 during the mounting.

The mounting method for mounting the above-mentioned semiconductor element 1 onto the alumina-laminated substrate 2 will be explained hereinafter with reference to FIGS. 10A–10D.

Figure 10A:
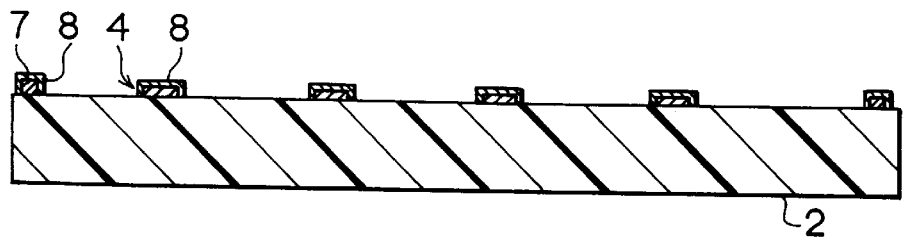
FIGS. 10A–10D are cross-sectional views showing a mounting process of the electronic part according to the seventh embodiment.

As shown in FIG. 10A, an alumina-laminated substrate 2, which has lands 4, a dummy land 7, and copper plates 8 formed on the lands 4 and the dummy land 7, is provided. Hereinafter, an explanation as to the copper plates 8 is omitted to clarify a relation between each of lands 4, 7.

The land 4, formed on the region where the semiconductor element 1 will be mounted, has a diameter of 0.08 mm, and a pitch between adjacent land 4 of 0.25 mm. The size of the dummy land 7 is not restricted especially, as long as the region of the lands 4 can be ascertained.

Figure 10B:
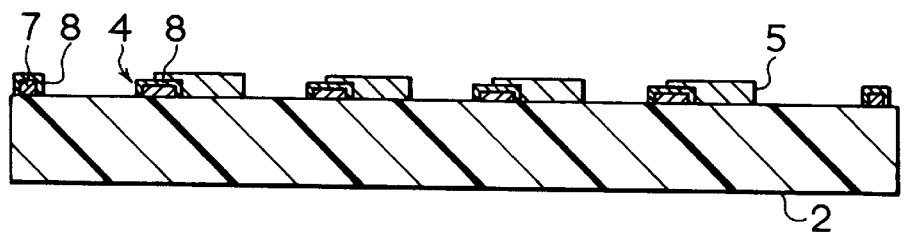

As shown in FIG. 10B, Ag pastes 5 are printed (formed) on the lands 4 having a diameter of 0.15 mm, by using the dummy land 7 as the alignment mark. A displacement may occur in this timing. However, each of the lands 4 is partially touched to each of the Ag paste 5, even if the displacement may occur.

As described above, the diameter of the land 4 is set to 0.08 mm. This diameter is determined so that the diameter of the land 4 is smaller than that of the Ag paste 5, and that the land 4 is not separated from the Ag paste 5 due to the displacement of the Ag paste printing.

Since the Ag paste 5 is hardened while maintaining its shape, the Ag paste 5 is not spread on the land 4. Hence, the size of the land 4 can be determined to smaller than that of the Ag paste 5. Specifically, the sizes of the land 4 and the Ag paste are determined so as not to separate each other even if the printing displacement occurs.

Relations among the diameter of the Ag paste 5, the diameter of the land 4, and the printing displacement, will be explained hereinafter with reference to FIG. 11. Here, the diameter of the Ag paste 5 is represented by $\phi 1$, the diameter of the land 4 is represented by $\phi 2$, and a maximum value of printing displacement is represented by X.

Figure 11:
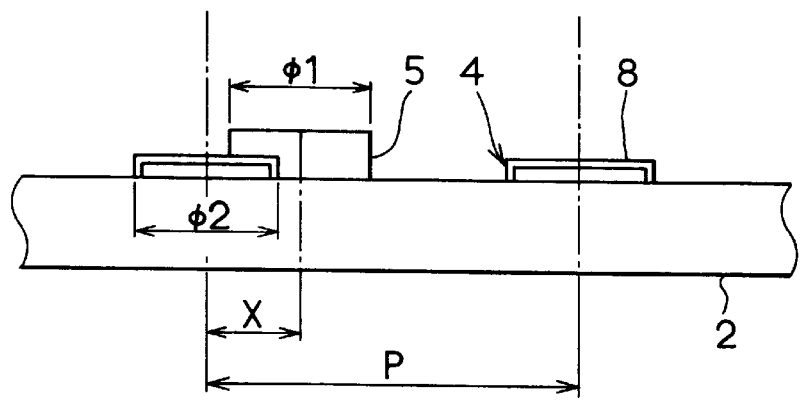
FIG. 11 is a diagram showing a relation between a diameter of an Ag paste, a diameter of land and a printing displacement.

As understood from FIG. 11, it is desirable to meet a relation of $2(X-\phi 2/2)<\phi 1$ to prevent the Ag paste 5 from separating from the land 4 due to the printing displacement. Therefore, based on the above-mentioned relation and a relation of $(\phi 1>\phi 2)$, which represents that the diameter of land 4 is smaller than that of the Ag paste 5, the diameter of the Ag paste $\phi 1$ is determined so as to meet a relation of $2(X-\phi 2/2)<\phi 1$.

Here, a land pitch P is determined in consideration of the diameter of the land 4, the diameter of the Ag paste 5, the printing displacement of Ag paste 5 and so on. Therefore, since the size of the land 4 can be set small, the pitch P can be decreased.

Figure 12A:
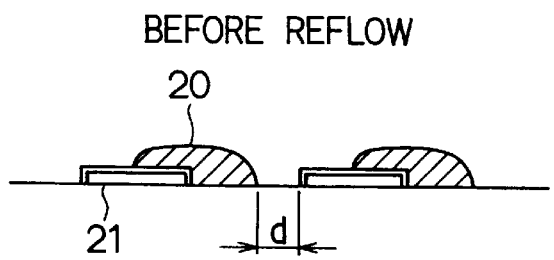
FIGS. 12A–12B are diagrams showing a land pitch when the solder paste is used according to a related art.
Figure 12B:
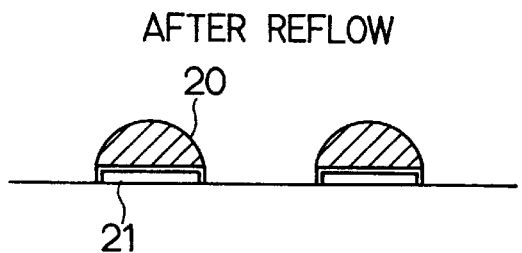
Figure 12C:
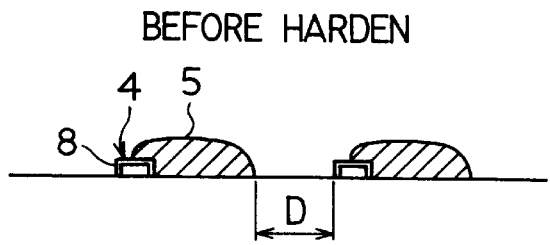
FIGS. 12C–12D are diagrams showing a land pitch when the Ag paste is used according to the seventh embodiment.
Figure 12D:
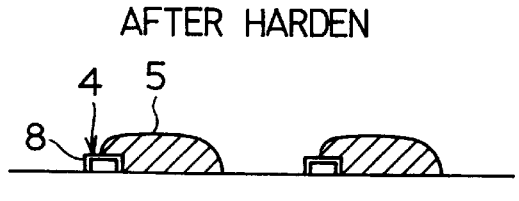

These merits will be explained in detail by comparing with related art mounting structure with reference to FIGS. 12A, 12B, which show the related art mounting structure using a solder paste 20, and FIG. 12C, 12D, which show the mounting structure using an Ag paste 5 according to this embodiment. Here, FIG. 12A shows before reflow the solder paste 20, and FIG. 12B shows after reflow the solder paste 20. On the contrary, FIG. 12C shows before hardening the Ag paste 5, and FIG. 12D shows after hardening the Ag paste 5 by annealing.

As shown in FIGS. 12A, 12B, since the solder paste 20 is spread onto the land 21 after reflow, it is desirable to set the diameter of the land 21 to be substantially equal to that of solder paste 20. However, since the Ag paste 5 can maintain its shape after the annealing, the Ag paste 5 and the land 4 can be electrically connected each other as long as they are touched each other.

Therefore, the mounting structure using the Ag paste 5 can decrease the size of the land 4. Consequently, an interval D shown in FIG. 12C is larger than an interval d shown in FIG. 12A by a degree the size of the land 4 is decreased. That is, the land pitch can be decreased by the degree the interval D is increased.

Figure 10C:
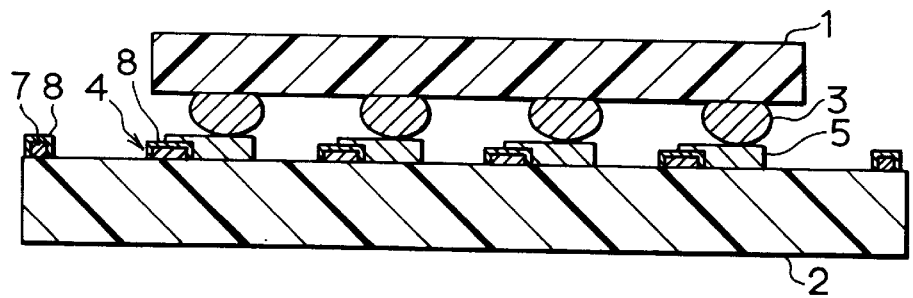

Next, as shown in FIG. 10C, the semiconductor element 1 is aligned so that the solder bumps 3 are accorded to Ag pastes 5 by using the dummy land 7 as the alignment mark. Then the semiconductor element 1 is mounted on the alumina-laminated substrate 2. Here, a load of 10 grams is applied to the semiconductor element so that all solder bumps 3 are contacted to the Ag pastes 5.

If an extra Ag paste for alignment is printed at other region of semiconductor element 1 in Ag paste printing process shown in FIG. 10B, the semiconductor 1 can be aligned by using an alignment mark taking the printing displacement of the Ag paste into consideration. Hence, displacement between the Ag paste 5 and the solder bump 3 can be further decreased, and the bonded state between the Ag paste 5 and the solder bump 3 can be further improved.

Figure 10D:
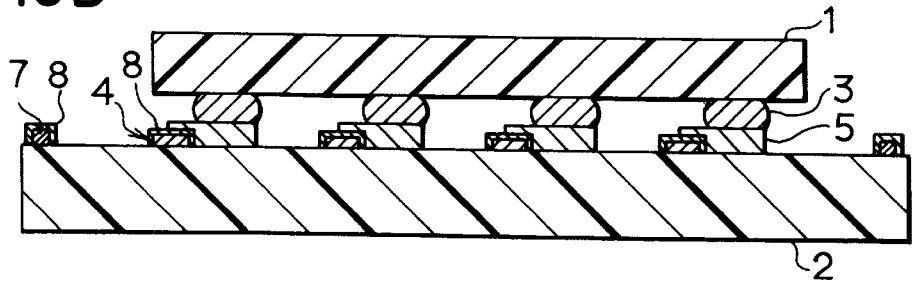

Then, the Ag paste 5 is hardened by anneal of 150° C., 1 Hour, to bond the solder bump 3 and the Ag paste 5, as shown in FIG. 10D. By this anneal, the semiconductor element 1 and the alumina-laminated substrate 2 is electrically connected, and the mounting structure shown in FIG. 9 is obtained.

In this way, using the conductive adhesive such as the Ag paste can decrease the size of the land 4. Consequently, the land pitch can be decreased. Furthermore, when the land pitch is decreased, the Ag paste 5 can be extruded from the land 4, and the same merit as that of the first embodiment can be obtained.

Eighth Embodiment

Figure 13:
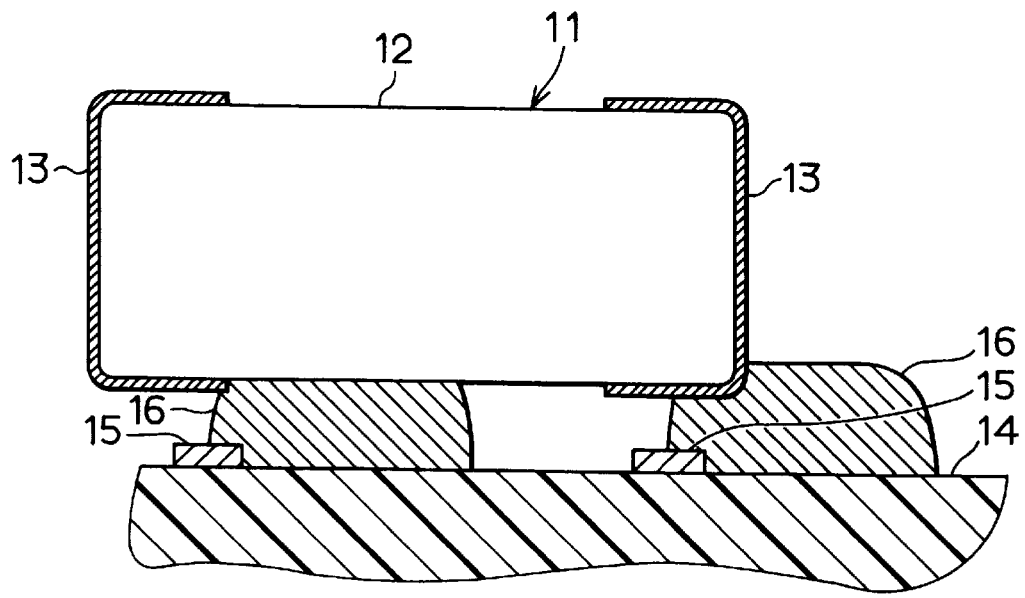
FIG. 13 is a cross-sectional view showing a mounting structure of an electronic part according to an eighth embodiment of the present invention.
Figure 15:
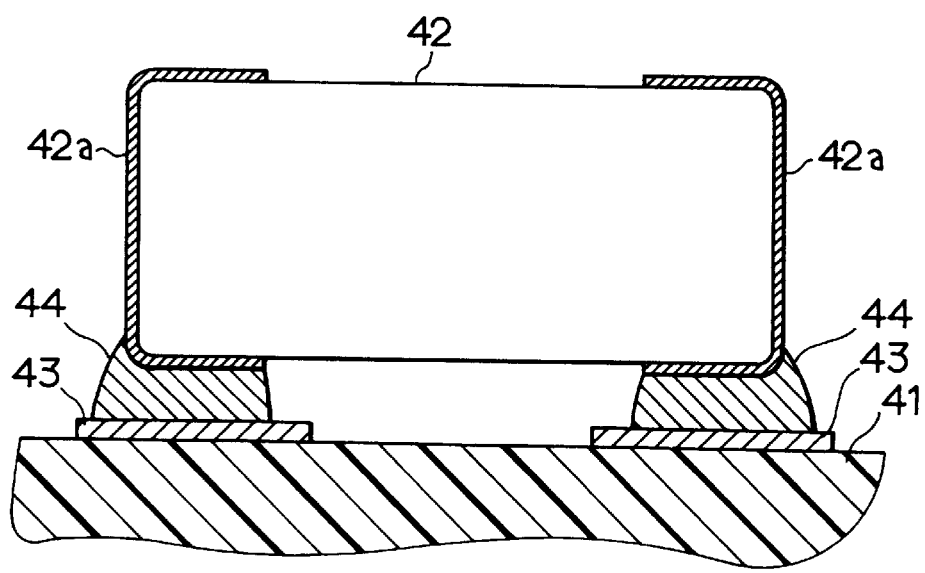
FIG. 15 is a cross-sectional view showing a mounting structure of an electronic part according to a related art.

An eighth embodiment will be explained with reference to FIG. 13. In recent years, further miniaturization (narrower electrode pitch) has been desired. For example, it is desired a 2012 size capacitor, which is smaller than the 3216 size capacitor described in the first embodiment, and further a 1005 size capacitor, which is smaller than the 2012 size capacitor, has been desired.

This embodiment can be adapted to either of the 1005, 2012, 3216 size capacitors. In this embodiment, a mounting structure that the present invention is adapted to a 1005 size laminated ceramic capacitor (electronic part) will be explained hereinafter. In FIG. 13, a distance between each end portion of the substrate electrode 15, which is arranged on the mounting substrate 14, is set to 0.6 mm.

The Ag paste (conductive adhesive, conductive bonding member) 16 is printed on the mounting substrate 14 so that a width of the substrate electrode 15 in arranged direction is 0.6 mm. Then, the laminated ceramic capacitor 11 is mounted on the mounting substrate 14, and the Ag paste is hardened. In this way, the Ag paste is extruded from the substrate electrode 15, consequently, the Ag paste is bonded by a face-contact to at least one of the main body chip 12 of the laminated ceramic capacitor 11 and the mounting substrate 14.

In this mounting structure, when a variation of a baking contraction is 0.5% (i.e., 0.5 mm variation in 10 mm×10 mm chip), and further when a displacement from the center portion is 0.25 mm and a printing displacement is 0.05 mm, a maximum displacement due to the displacement factors is estimated around 0.255 mm by calculating root mean square of each displacement.

Figure 14A:
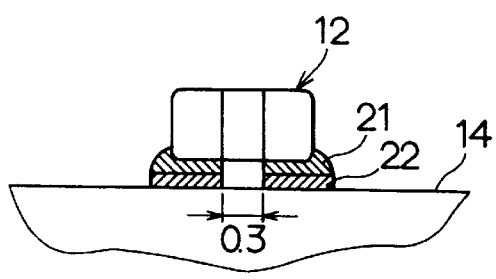
FIGS. 14A–14B are diagrams showing a land pitch when the solder paste is used according to a related art.
Figure 14B:
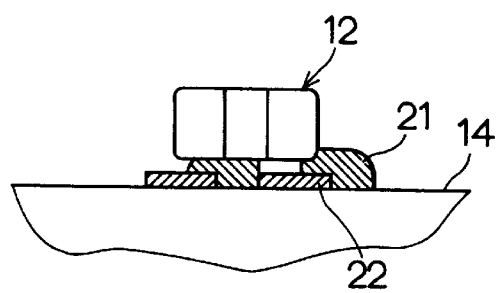
Figure 14C:
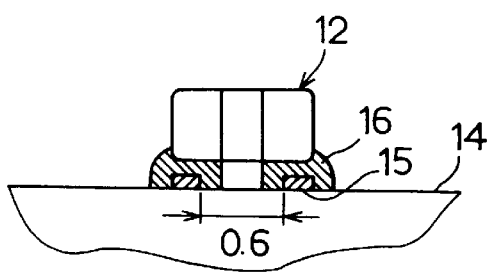
FIGS. 14C–14D are diagrams showing a land pitch when the Ag paste is used according to the eighth embodiment.
Figure 14D:
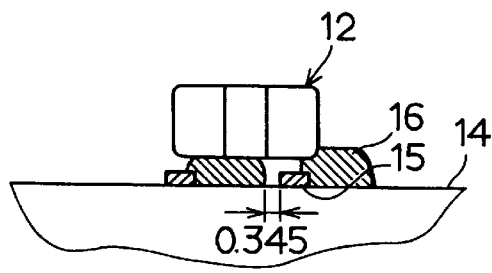
Figure 16A:
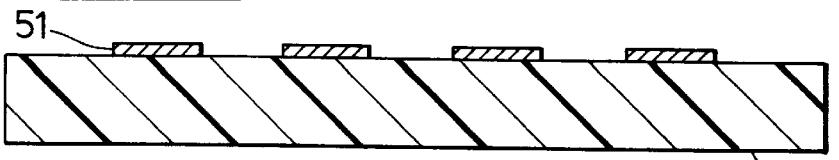
FIGS. 16A–16D are cross-sectional views showing a mounting process of the electronic part according to a prior art.
Figure 16B:
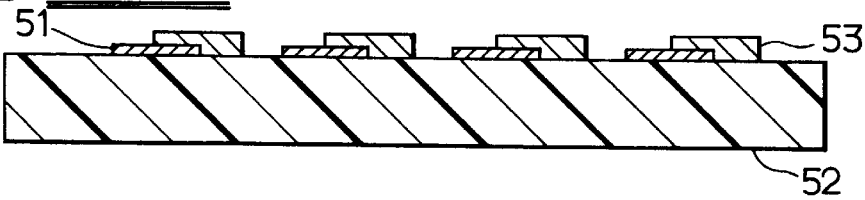
Figure 16C:
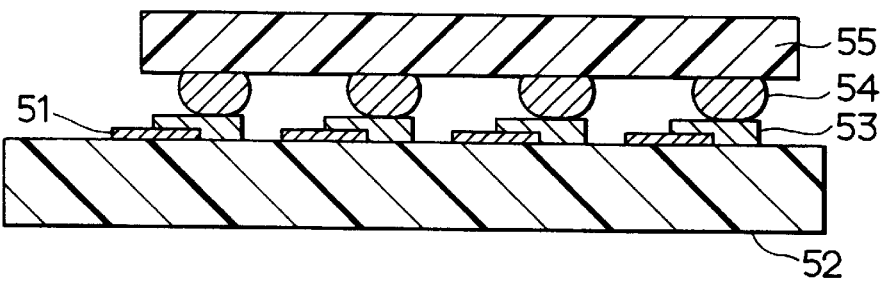
Figure 16D:
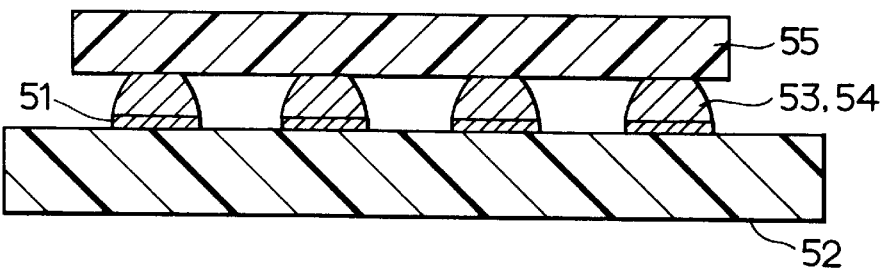
Figure 17:
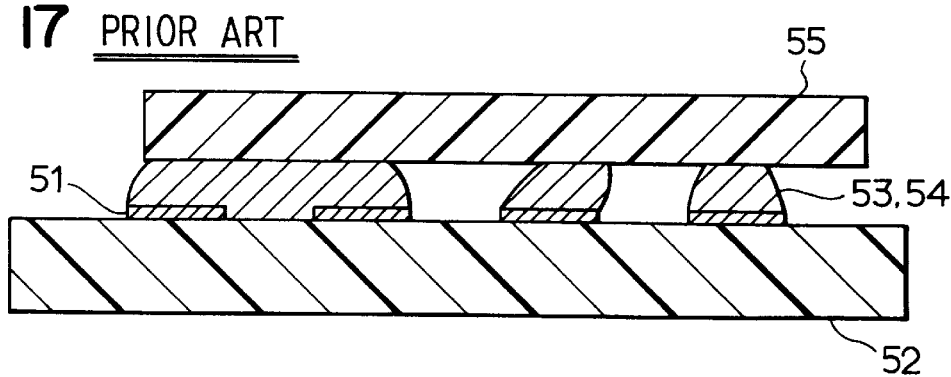
FIG. 17 is a cross-sectional view showing a mounting structure of an electronic part according to a prior art.

The displacement of this mounting structure will be explained in detail by comparing with related art mounting structure. FIGS. 14A, 14B show the related art mounting structure, which uses a solder paste 21, and a size of the solder paste is substantially equal to that of the substrate electrode 22. FIGS. 14C, 14D show the mounting structure, which uses an Ag paste 5 according to this embodiment. Here, FIG. 14A shows before reflow the solder paste 21, and FIG. 14B shows after reflow the solder paste 21. On the contrary, FIG. 14C shows before hardening the Ag paste 5, and FIG. 14D shows after hardening the Ag paste 5 by annealing. In FIGS. 14A–14D, distances between each center portion (land pitch) of adjacent substrate electrodes 15, 22 are set to substantially equal each other.

In the case of the related art structure shown in FIGS. 14A, 14B, when the sizes of the substrate electrode 22 and the solder paste 21 are set to be equal, an interval between the nearest end portion of adjacent substrate electrodes 22 is 0.3 mm. Therefore, when the displacement is at its maximum, the adjacent substrate electrodes 22 may be short-circuit by flowing of the melted solder paste 21.

On the contrary, in the case of the structure according to this embodiment, shown in FIGS. 14C, 14D, the interval between the nearest end portion of adjacent substrate electrodes 15 is 0.6 mm. Therefore, when the displacement is at its maximum, an interval between the nearest end portion of adjacent substrate electrode 15 and the Ag paste is 0.345 mm. Since the Ag paste 16 can maintain its shape as printed as described above, the short-circuit between adjacent substrate electrodes 15 can be prevented.

As described above, the short-circuit between adjacent substrate electrodes 15 can be prevented by setting the size of the substrate electrode 15 to be smaller than that of the Ag paste 16. Furthermore, adhesive strength between the Ag paste 16 and the mounting substrate 14 or the main body chip 12 can be improved.

Other Embodiments

The present invention can be adapted to the other electronic part mounting structure such as other type surface mounting capacitor, coil and so on, replacing with the laminated ceramic capacitor 11 or the surface mounting capacitor 19 described the above. In the above-mentioned embodiment, the Ag paste as the conductive adhesive includes epoxy rein filling the Ag filler is used. However, material of the binder of the Ag paste and the conductive filler can be selected from other material. The 92% alumina-laminated substrate 14 can be replaceable with the other substrate such as a ceramic substrate or a rein substrate.

Specifically, the alumina-laminated substrate 2 as the mounting substrate can be replaceable with a low temperature baking substrate made by such as a glass, an alumina or a glass ceramic, a resin substrate made by such as an epoxy, a glass epoxy, a paper phenol or a polyimide, or an AlN (aluminum nitride) substrate based metal. It is acceptable to coat a coating material on the mounting substrate, as described in the third embodiment, using one of above-mentioned materials, or an ultraviolet ray hardening resin such as an epoxy acrylate.

In the first to eighth embodiments, a paste type adhesive as the conductive adhesive can be used. Here, the paste type adhesive can be made by a resin, which includes at least one of a phenol, an acrylic, a polyester and a polyimide, has a metallic filler, which includes at least one of Ag, Au, Ni, Cu, Pd, Pt, Ir, AgPd or AgPt.

As described above, the adhesive strength between the Ag paste and the alumina or the glass epoxy is larger than that between the Ag paste and the copper constituting the land (electrode). For the same reason, it is desirable to reduce the size of the land, even if the other material is used for the conductive adhesive, because the reduction of the land enables to increase the contact area between the conductive adhesive and the body member or the mounting substrate.

In the above-mentioned embodiments, the adhesive strength can be improved when at least one portion of the peripheral portion of the Ag pastes 5, 16 are bonded to at least one of a surface of the main body chip 12, a surface of the resin base portion 12, or a surface of the mounting substrate 32, 14. Consequently, the crack can be prevented even by the Ag paste.

What is claimed is:

1. A mounting method of an electronic part having first and second electrodes, comprising:
   printing a conductive adhesive on first and second lands provided on a mounting substrate, the conductive adhesive having a size larger than that of a corresponding one of the first and second lands on which the conductive adhesive is mounted;
   mounting the electronic part on the mounting substrate while aligning the conductive adhesive and first and second electrodes of an electronic part; and
   hardening the conductive adhesive by heat.

2. A mounting method according to claim 1, wherein the printing step includes to print the conductive adhesive being extruded from the first and the second lands.

3. A mounting method according to claim 1, wherein:
   the printing step prints an alignment portion by the conductive adhesive at the other portion of the first and the second lands on the mounting substrate, and
   the aligning step aligns the electronic part by using the alignment portion as an alignment mark.

4. A mounting method according to claim 1, wherein the printing step prints the conductive adhesive being thicker than a thickness after hardening.

5. A mounting method according to claim 1, wherein the mounting step includes a controlling step to control a shape of the conductive adhesive by controlling a load applied to the electronic part during mounting.

6. A mounting method according to claim 1, wherein:
   the printing step print s an additional portion at the other portion of the first and the second lands on the mounting substrate, and
   the additional portion is bonded to at least one of the body member and the mounting substrate in the mounting step.

7. A mounting method of an electric part on a mounting substrate, wherein the electric part includes includes an electronic part having first and second electrodes and a mounting substrate mounting the electronic part, the method comprising:

providing first and second lands on the mounting substrate so that the first and second lands are arranged at predetermined portions corresponding to the first and second electrodes of the electronic part; and providing a conductive adhesive between the first electrode and the first land, and between the second electrode and the second electrode, to connect electrically the electronic part and the first and second lands, wherein one part of the conductive adhesive is extruded from one of the first land, the second land, the first electrode and the second electrode.

8. A mounting method of an electric part on a mounting substrate, wherein the electric part includes an electronic part having a body member made by an insulating material, and first and second electrodes provided on the body member, the method comprising:

providing first and second lands on the mounting substrate so that the first and second lands are arranged at predetermined portions corresponding to the first and second electrodes of the electronic part; and providing a conductive adhesive between the first electrode and the first land, and between the second electrode and the second electrode, to connect electrically the electronic part and the first and second lands, wherein at least one part of the peripheral portion of the conductive adhesive has a bonding portion, that is bonded to the body member of the electronic part.

9. A mounting method of an electric part on a mounting substrate, wherein the electric part includes an electronic part having a body member made by an insulating material, and first and second electrodes provided on the body member, the method comprising:

providing first and second lands on the mounting substrate so that the first and the second lands are arranged at predetermined portions corresponding to the first and second electrodes of the electronic part; and providing a conductive adhesive between the first electrode and the first land, and between the second electrode and the second electrode, to connect electrically the electronic part and the first and second lands, wherein the first and the second lands are arranged in a predetermined direction, and each of the first and second lands has a size smaller than a size of the conductive adhesive in the predetermined direction.

10. A mounting method according to claim 8, wherein the bonding portion is bonded to the body member of the electronic part directly.

11. A mounting method according to claim 8, wherein the peripheral portion of the conductive adhesive directly contacts both the body member of the electronic part and a part of the mounting substrate other than the first and second lands.

12. A mounting method of an electronic part having first and second electrodes, comprising:

printing a first conductive adhesive on a first land provided on a mounting substrate, the first conductive adhesive having a size larger than the first land on which the first conductive adhesive is mounted;

printing a second conductive adhesive on a second land provided on the mounting substrate, the second conductive adhesive having a size larger than the second land on which the second conductive adhesive is mounted;

mounting the electronic part on the mounting substrate while aligning the conductive adhesive and first and second electrodes of an electronic part; and hardening the conductive adhesive by heat.

* * * * *